United States Patent
McLachlan et al.

(10) Patent No.: US 8,537,043 B1
(45) Date of Patent: Sep. 17, 2013

(54) DIGITAL-TO-ANALOG CONVERTER WITH CONTROLLED GATE VOLTAGES

(75) Inventors: Roderick McLachlan, Edinburgh (GB); Avinash Gutta, Bangalore (IN); Fergus Downey, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/445,183

(22) Filed: Apr. 12, 2012

(51) Int. Cl.
*H03M 1/66* (2006.01)

(52) U.S. Cl.
USPC ........... 341/144; 365/148; 327/172; 375/232; 375/316; 330/149; 708/313

(58) Field of Classification Search
USPC .................. 341/130–144; 365/148; 327/172; 375/232, 316; 330/149; 708/313
See application file for complete search history.

(56) References Cited

U.S. PATENT DOCUMENTS

| | | | | |
|---|---|---|---|---|
| 4,635,038 A * | 1/1987 | Wincn | ........................... | 341/136 |
| 5,764,174 A * | 6/1998 | Dempsey et al. | ............. | 341/154 |
| 5,936,563 A * | 8/1999 | Nakamura | .................... | 341/144 |
| 6,177,900 B1 * | 1/2001 | Nakaigawa | .................... | 341/160 |
| 6,266,001 B1 * | 7/2001 | Fang et al. | ..................... | 341/144 |
| 7,012,555 B2 * | 3/2006 | Voicu et al. | .................... | 341/154 |
| 7,023,367 B1 * | 4/2006 | Manganaro | ................... | 341/136 |
| 7,312,714 B2 * | 12/2007 | Morris | ......................... | 340/628 |
| 7,345,611 B2 * | 3/2008 | Voicu et al. | .................... | 341/145 |
| 7,535,395 B2 * | 5/2009 | Voicu et al. | .................... | 341/144 |
| 7,652,613 B2 * | 1/2010 | Joet et al. | ....................... | 341/172 |
| 7,671,780 B2 * | 3/2010 | Joet | ................................ | 341/172 |
| 8,014,443 B2 * | 9/2011 | Nakamura et al. | ............ | 375/232 |
| 8,242,945 B2 * | 8/2012 | Sawai | ........................... | 341/155 |
| 8,379,011 B2 * | 2/2013 | Bae et al. | ...................... | 345/212 |
| 2008/0187035 A1 * | 8/2008 | Nakamura et al. | ............ | 375/232 |
| 2010/0179977 A1 * | 7/2010 | Wei et al. | ...................... | 708/313 |

OTHER PUBLICATIONS

PCT International Search Report and Written Opinion for PCT/US2013/34069 mailed on May 30, 2013.

* cited by examiner

*Primary Examiner* — Lam T Mai

(74) *Attorney, Agent, or Firm* — Kenyon & Kenyon LLP

(57) ABSTRACT

A digital-to-analog converter (DAC) includes a resistor leg that is switchably connected to a first voltage reference via an n-channel MOSFET and to a second voltage reference via a p-channel MOSFET, and a generator circuit. The generator circuit further includes a first sub-circuit for generating a drive voltage (Vgn) and a second sub-circuit for a) offsetting the first drive voltage by an offset voltage to generate a second drive voltage, and b) supplying the second drive voltage to a gate of one of the first NMOS and the first PMOS.

20 Claims, 5 Drawing Sheets

DIGITAL-TO-ANALOG CONVERTER WITH CONTROLLED GATE VOLTAGES

FIELD OF THE INVENTION

The present invention is generally directed to digital-to-analog converters (DACs), in particular, to methods and apparatus that may control gate voltages of NMOS and PMOS switches used in R-2R voltage-mode DACs.

BACKGROUND INFORMATION

A voltage-mode R-2R digital-to-analog converter (DAC) includes resistor legs that are switched between two reference voltages (Vref and the ground Vgnd) using a single-pole, double-throw switch. FIG. 1 illustrates a segmented voltage-mode R-2R DAC 100 that converts a digital code input into an analog voltage output (Vout). The segmented voltage-mode R2R DAC 100 may include a resistor ladder that further includes a number of legs. Each leg may include a resistor (2R) and a switch 106.1-106.6 so that the resistor (2R) is switchably connected to either a first position that connects to the ground (Vgnd) or a second position that connects to a reference voltage potential (Vref). The switches 106.1-106.6 are MOS switch pairs that are discussed in detail along with FIG. 2. Each leg of the resistor ladder (including a corresponding switch pair) is controlled by a bit of the digital code according to an order of a least significant bit (LSB) at the left side to a most significant bit (MSB) at the right side. If the bit value equals zero, the switch is switched to the first position so that the corresponding leg is connected to Vgnd; if the bit value equals one, the switch is switched to the second position so that the corresponding leg is connected to Vref. Thus, the digital code may be converted into an analog voltage output (Vout) through voltage attenuation over the resistor ladder.

The segmented voltage-mode R-2R DAC 100 may be divided into two portions. A first portion on the left side of the dashed line is an R-2R DAC 102, and a second portion on the right side of the dashed line is a segmental DAC 104. The R-2R DAC 102 may include digital bits of lower significance, while the segmented DAC may include bits of higher significance. Together, the R-2R DAC 102 and the segmental DAC 104 form the segmented voltage-mode R-2R DAC 100.

FIG. 2 illustrates a detailed circuit schematic for the MOS switches 106.1-106.6. Referring to FIG. 2, a switch 200 (that can be any one of the MOS switches 106.1-106.6) receives a digital bit B(N) and outputs a voltage of Vgnd or Vref to the resistor (2R) in a leg of the segmented voltage-mode R-2R DAC. The switch 200 includes drivers 202, 204, and a p-channel MOSFET (PMOS) 206, and an n-channel MOSFET (NMOS) 208. The drivers 202, 204 respectively receive the digital bit B(N), while the outputs of drivers 202, 204 are coupled to the gates of the PMOS 206 and NMOS 208, respectively. Based on the digital input, the output of driver 202 may be driven to either a reference voltage Vgp or a positive supply voltage Vdd, and the output of driver 204 may be driven to either a reference voltage Vgn or a negative supply voltage Vss. In operation, the PMOS 206 and the NMOS 208 form a complementary MOS switch pair so that, at any moment, if the gate voltage of the PMOS 206 is at Vgp, the gate voltage of the NMOS 208 is at Vss; or alternatively, if the gate voltage of the PMOS 206 is at Vdd, the gate voltage of the NMOS 208 is at Vgn. Therefore, at any moment, only one of PMOS 206 and NMOS 208 is on.

An ideal switch, when it is ON (or engaged), has zero resistance. However, in practice, when PMOS 206 or NMOS 208 is ON, each of the MOS switches has an ON resistance. Further, the ON resistance for PMOS 206 is commonly different from the ON resistance for NMOS 208. This unequal ON resistances between PMOS 206 and NMOS 208 cause inaccuracy in the DAC output. U.S. Pat. No. 5,075,677 (the '677 patent) (assigned to the assignee of the present application) describes a Vgn generator circuit that supplies adjustable Vgn (or similarly, adjustable Vgp) to driver 204 (or similarly, driver 202) so that the apparent ON resistances for the PMOS and NMOS switches are substantially same.

FIG. 3 illustrates a Vgn generator as described in the '677 patent. Referring to FIG. 3, the Vgn generator 300 includes an op-amp 302, a PMOS 304, an NMOS 306, and resistors 308-314. Resistors 308, 310 are selected to have a same first resistance (R1) within a precision range, and resistors 312, 314 are selected to have a same second resistance (R2) within a precision range. Since the resistors 312, 314 are selected to have a same second resistance, the voltage at node 318 is Vref/2 which is supplied to the inverted input of the op-amp 302. By operation of the op-amp 302, the voltage at the non-inverted input of the op-amp 302 follows the inverted input and also equals to Vref/2. Further, since resistors 308, 310 also have the same resistance, the voltage drops over resistors 308, 310 are also the same and thereby Vds for PMOS 304 equals Vds for NMOS 306. The Vds balance between PMOS 304 and NMOS 306 is achieved by adjusting Vgn as the gate of the NMOS 306. The adjustable Vgn is applied to the gate of the NMOS switch 208. In this way, the '677 patent chooses Vgn for NMOS switch which results in equalizing the ON resistances between the NMOS switch 208 and the PMOS switch 206. While FIG. 3 illustrates a Vgn generator, a person of ordinary skill in the art would understand that a Vgp generator may be similarly constructed with the output being coupled to the gate of PMOS 304 and the gate of NMOS 306 being coupled to Vref. Therefore, the following embodiments are discussed in terms of the Vgn generator for convenience.

To reduce sensitivity to the input offset (Vos) of op-amp 302 and to reduce sensitivity to resistor mismatches, current art uses a moderately large Vds for the PMOS 304 and NMOS 306 in the Vgn generator so that they are much larger than Vds for PMOS 206 and NMOS 208, namely, Vds [Vgn]>>Vds [DAC]. However, as shown in the following, this causes non-linearity in the resistor legs in the DAC, which is undesirable, especially for bits of higher significance such as MSB.

DETAILED DESCRIPTION OF EXAMPLE EMBODIMENTS

Figure 1:
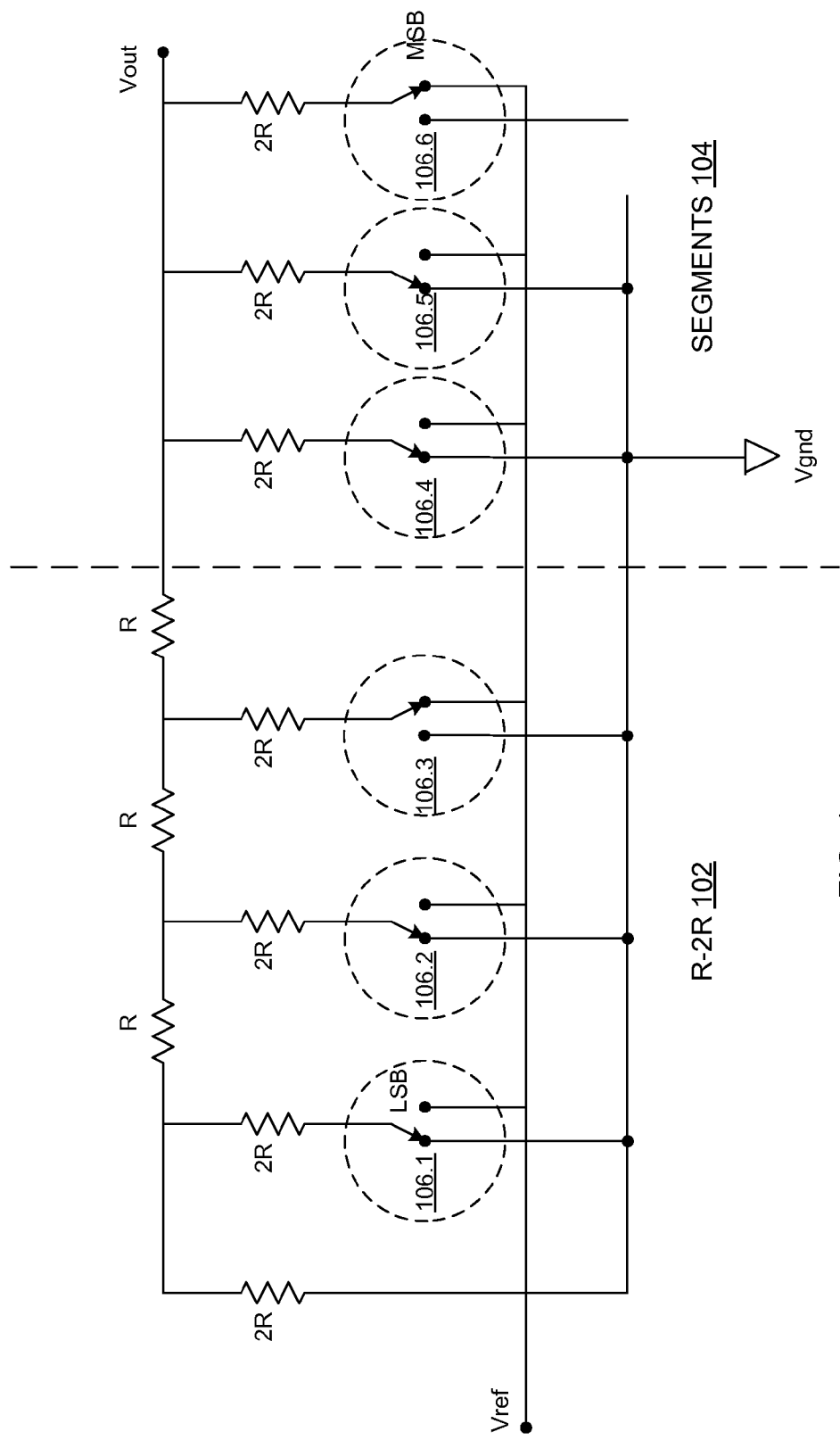
FIG. 1 illustrates a segmented voltage-mode R-2R digital-to-analog converter.
Figure 2:
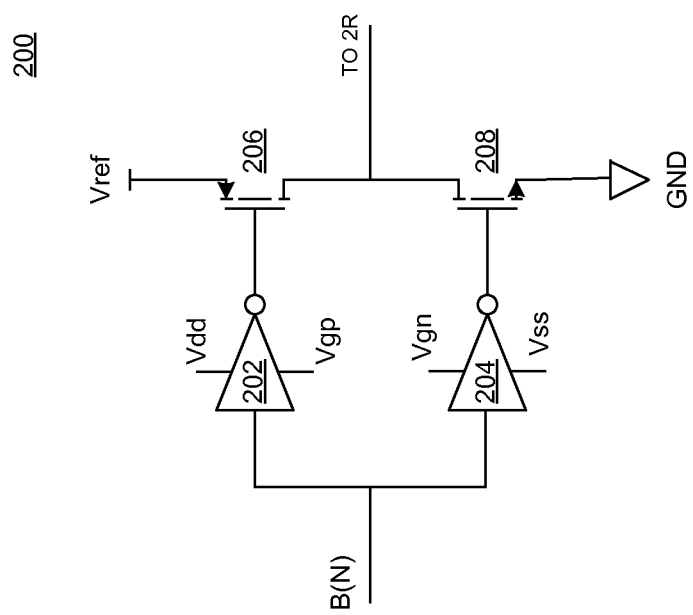
FIG. 2 illustrates a switch including a complementary PMOS and NMOS pair.
Figure 3:
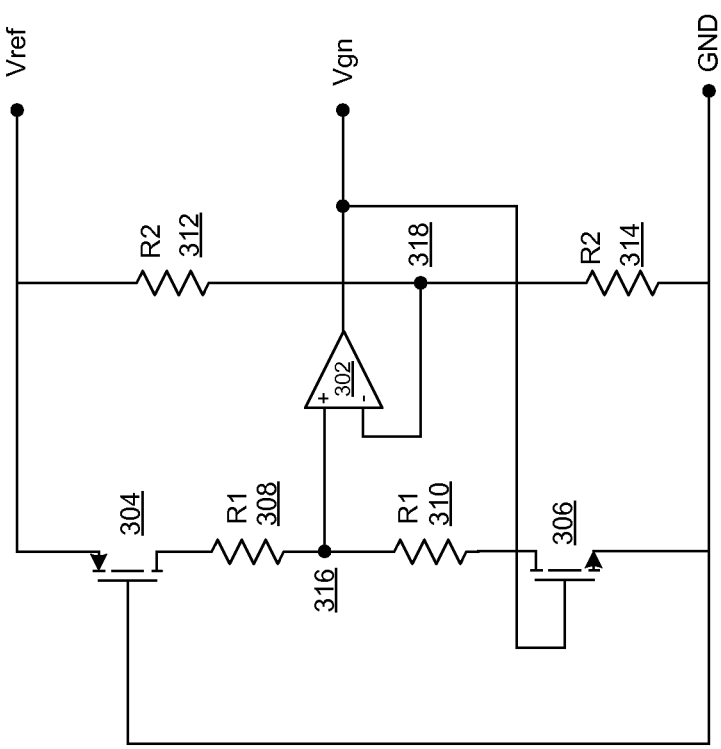
FIG. 3 illustrates a Vgn generator.

The current $I_{DS}$ going through a MOS transistor may include a non-linear factor with respect to Vds. For example, with respect to NMOS 306 as shown in FIG. 3, it is known that $I_{DS}$, i.e., the current from drain to source $$I_{DS} = K'\frac{W}{L}\left\{(V_{GS} - V_T)V_{DS} - \frac{V_{DS}^2}{2}\right\} = K'\frac{W}{L}\left(V_{GS} - V_T - \frac{V_{DS}}{2}\right)V_{DS'} \quad (1)$$

where K' is a constant coefficient, W/L is the width to length ratio of the NMOS, $V_{GS}$ is gate-to-source voltage, $V_T$ is a threshold voltage over which the NMOS is ON, and $V_{DS}$ is the voltage drop from drain to source. Therefore, ON resistance $R_{ON}$ (=$V_{DS}/I_{DS}$) may depend on $V_{DS}$, including a non-linear factor which may increase when $V_{DS}$ is large. However, the resistor legs of the DAC are usually designed so that the NMOS switches may have a small Vds, particularly in the switches for MSB resistor legs. Thus, a conflict exists between linearity and accuracy of the output of the DAC. Although it is desirable that $V_{DS}$ is large so that operation of the "Vgn Generator" is less sensitive to op-amp offset and resistor mismatc, large $V_{DS}$ unfortunately also generates non-linearity in the ON resistance which in turn may cause non-linearity in the DAC. Current art makes compromises by using a moderately large $V_{DS}$, and subsequently trimming the circuit such as laser trimming to reduce errors that result from the compromised sensitivity of the "Vgn Generator" to op-amp offsets and resistor mismatches.

It is an objective of this invention to provide good output accuracy without the need for subsequent trimming or calibration. It is also an objective of the present invention to provide good output accuracy without the need for adding an additional negative supply rail.

Embodiments of the present invention may include a digital-to-analog converter (DAC) that may include at least one resistor leg that is switchably connected to one of a first voltage reference via a first n-channel MOSFET (NMOS) and to a second voltage reference via a first p-channel MOSFET (PMOS), and a generator circuit that may include a first sub-circuit for generating a first drive voltage (Vgn) and a second sub-circuit for a) offsetting the first drive voltage by an offset voltage to generate a second drive voltage, and b) supplying the second drive voltage to a gate of one of the first NMOS and the first PMOS.

Embodiments of the present invention may include a generator circuit for a digital-to-analog converter. The generator circuit may include a first sub-circuit for generating a first drive voltage (Vgn), and a second sub-circuit for a) offsetting the first drive voltage by an offset voltage to generate a second drive voltage, and b) supplying the second drive voltage to a gate of one of the first NMOS and the first PMOS.

Embodiments of the present invention may include a digital-to-analog converter (DAC) that may include a plurality of resistor legs, each resistor leg corresponding to a digital bit having a bit significance, each resistor leg being switchably connected to one of a first voltage reference and to a second voltage reference via a respective MOS pair, the respective MOS pair each including a first NMOS and a first PMOS, and a generator circuit that may include a first sub-circuit for generating a first drive voltage (Vgn), and a second sub-circuit for a) offsetting the first drive voltage by a plurality of offset voltages to generate a plurality of second drive voltages and b) supplying each of the plurality of the second drive voltages and the corresponding offset voltages to the respective MOS pair.

Figure 4:
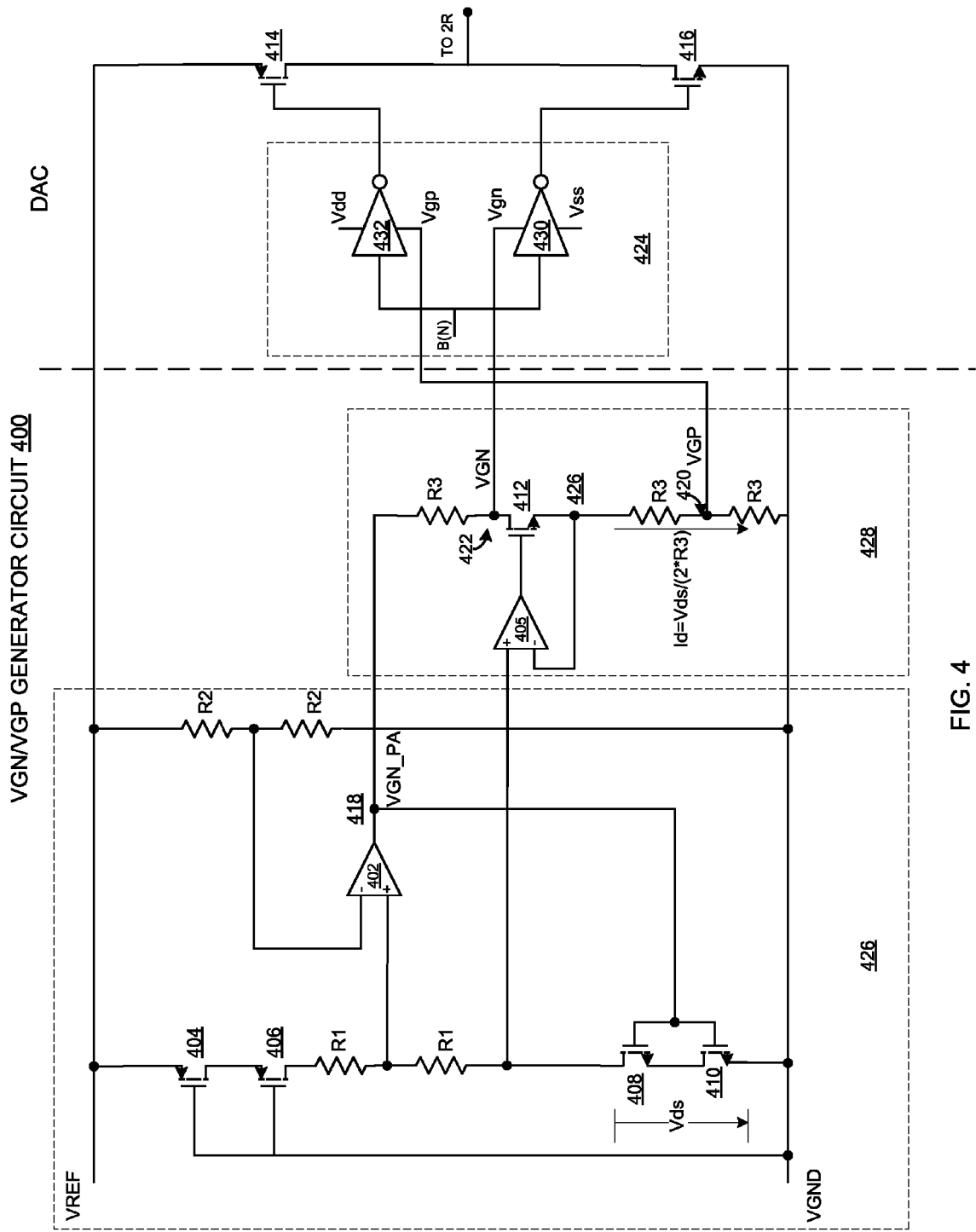
FIG. 4 illustrates a Vgn generator according to an exemplary embodiment of the present invention.

Embodiments of the present invention may include a generator circuit that may include additional circuitry that cancels the non-linear error term. As shown in Equation (1), the nonlinearity may be reduced if Vgs is reduced by a certain amount, preferably by Vds/2. FIG. 4 illustrates a Vgn/Vgp generator according to an exemplary embodiment of the present invention. The Vgn/Vgp generator 400 may include a first sub-circuit 426 and a second sub-circuit 428. Further, for convenience of illustration, FIG. 4 also shows a resistor leg of a DAC including a PMOS switch 414, an NMOS switch 416 that are driven by a driver circuit 424, and two resistors (Rdac). The first sub-circuit 426 and the second sub-circuit 428 together may form the Vgn/Vgp generator 400, whereas the first sub-circuit 426 reflects the Vgn generator as shown in FIG. 3, and the second sub-circuit 428 is a circuit that may be used to subtract Vds/2 (in the Vgn/Vgp generator) from the output of the first sub-circuit 426.

In one embodiment of the present invention, the first sub-circuit 426 may include an op-amp 402, stacked PMOS 404, 406, stacked NMOS pair 408, 410, and two resistor pairs R1, R2. The first sub-circuit 426 may operate in essentially the same as way as the Vgn generator as shown in FIG. 3. The stacked PMOS pair 404, 406 and stacked NMOS pair 408, 410 are used to illustrate their respective Vds is larger than those in DAC. Thus, the Vgn of prior art (VGN_PA) at node 418, if used in the DAC would include non-linear effects due to the extra term of Vds/2.

The second sub-circuit 428 may subtract Vds/2 from the voltage output at node 418 and supply appropriate gate voltages to the respective gates of PMOS switch 414 and NMOS 416. The second sub-circuit 428 may include an op-amp 405, an NMOS 412, and three resistors (R3). The non-inverted input of the op-amp 405 is coupled to a drain of the stacked PMOS 408 so that the non-inverted input of the op-amp 405 has an input voltage of Vds. The NMOS 412 and the three resistors (R3) are serially connected so that two R3 are serially connected between the ground Vgnd and the source of NMOS 412, and the third R3 is coupled between the drain of NMOS 422 and the output of op-amp 402 (or node 418). The inverted input of op-amp 405 is coupled to the source of the NMOS 412, and the output of op-amp 405 is coupled to the gate of the NMOS 412. The drain of the NMOS 412 (node 422) may supply Vgn to a first driver 430 (in the driver circuit 424) whose output may be coupled to the gate of NMOS switch 416 of the DAC, and the junction 420 (between the two serially connected R3) may supply an offset voltage, here a reduction voltage, Vgp to a second driver 432 (in the driver circuit 424) whose output may be coupled to the gate of the PMOS switch 414 of the DAC.

By operation of op-amp 405, the inverted input may follow the non-inverted input so that the voltage at node 426 is also Vds. The current at the drain of NMOS 412, Id=Vds/(2*R3), which causes a drop of Vds/2 from node 418 to node 422, namely, at the gate of the NMOS switch 416 of the DAC. The gate voltage of PMOS switch 414 may be the same as that at node 420 at Vds/2. In this way, the gate voltages for the NMOS switch 416 and PMOS switch 414 may be shifted by Vds/2 and thus reduce the non-linearity in the DAC output. Embodiments of the present invention as shown in FIG. 3 may have the advantage of maximizing the Vds in the Vgn/Vgp generator circuit without the need to compromise non-linearity for the more significant bits and without the need to trim the circuit.

In one embodiment of the present invention, the size of both PMOS and NMOS switches for different bits may be scaled from the MSB's (or switches in the segments portion of the segmented DAC) down to the LSB's (or switches in the R-2R portion of the segmented DAC). For example, the scaling scheme may be binary scaling—i.e., the size of a lower bit is half the size of the immediate higher bit. Other scaling technique such as Conroy scaling may also be used. Regardless of the scaling schemes, W/L (or the width to length ratio) of an MSB switch is much larger than W/L of the last LSB switch. Since the ON resistance is inversely proportional to the W/L ratio, the MSB's have a much smaller ON resistance than the LSB's. Thus, for a same current that flows through an MSB switch and a LSB switch, the voltage drop over the LSB switch may be much larger than the voltage drop over the MSB switch. In the present DAC setup, the current flowing through the switches and thus the voltage drop across the switches are a function of the digital input code, where the voltage drops across the switches for MSB's may be negligible, and the voltage drops across the switches for LSB's may have a large variations.

It is desirable to factor into the non-negligible voltage drops across the switches for LSB's by supply a smaller voltage correction for LSB's. In one exemplary embodiment, rather than Vds/2 correction for MSB's, the LSB's may be supplied with Vds/4 correction.

Figure 5:
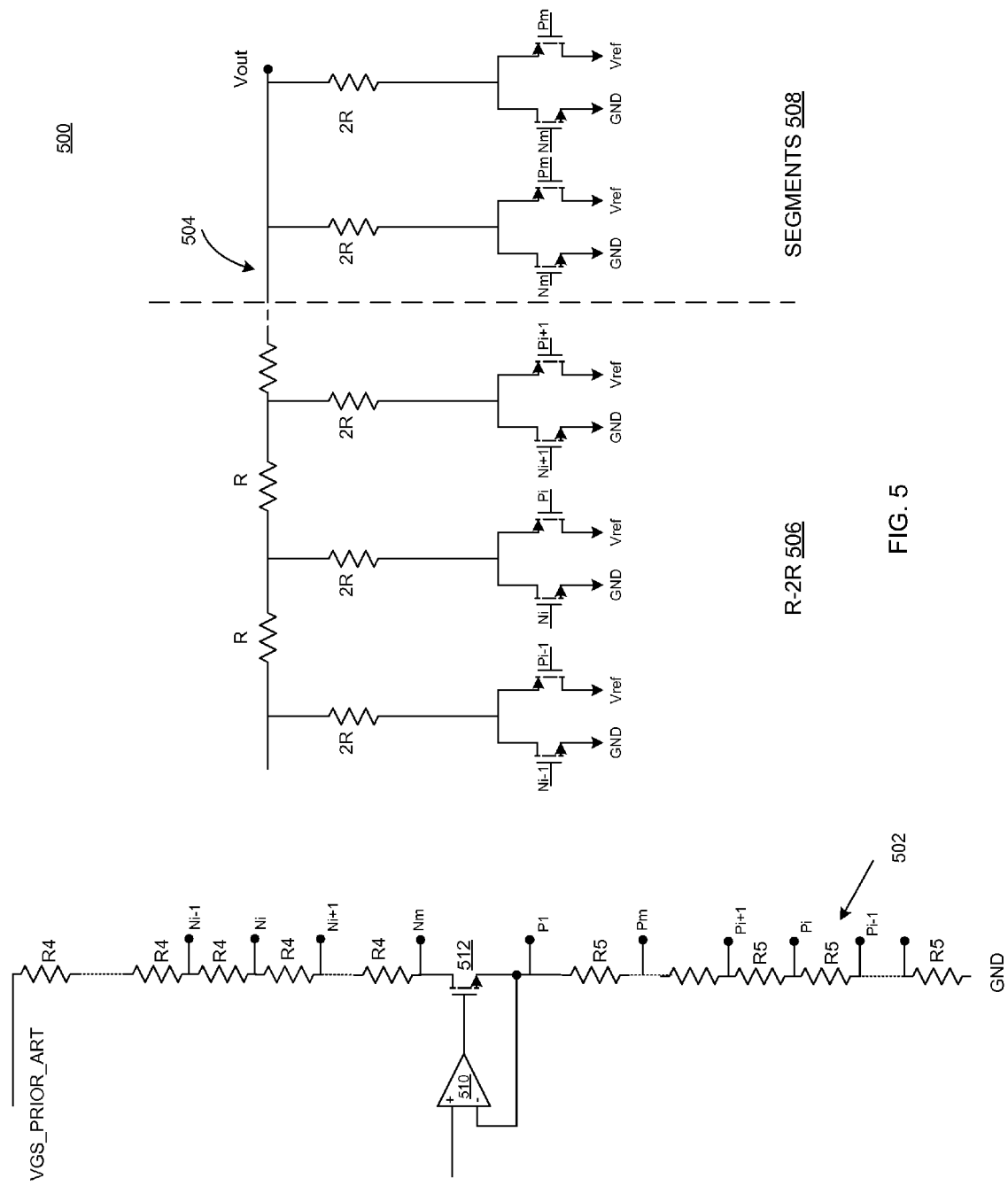
FIG. 5 illustrates a Vgn generator according to another exemplary embodiment of the present invention.

In another exemplary embodiment, the gate voltages for LSB's switches may be generated variably in accordance to the corresponding bit position. Accordingly, the gate voltage at a lower significant bit in the LSB region may have smaller voltage correction, while the gate voltage at a higher significant bit in the LSB region may have larger voltage correction. FIG. 5 illustrates a segmented R-2R DAC that have variable gate voltages for LSB's according to an exemplary embodiment of the present invention. Referring to FIG. 5, a segmented R-2R DAC 504 may include a segmental portion 506 for MSB's and a R-2R portion for LSB's. The gate voltages for the MSB's in the segmental portion 506 may be similar to FIG. 4, including a voltage correction of Vds/2. However, the gate voltages for the LSB's in the R-2R potion may be variable, depending on the digital bit position, and supplied from Vgn/Vgp generator. As discussed in FIG. 4, the Vgn/Vgp generator may be similar to the first sub-circuit 406 as shown in FIG. 4 for generating a Vgn without correction, and a second sub-circuit 502 for correcting the generated Vgn by a correction voltage.

The sub-circuit 502 may include an op-amp 510, an NMOS 512, a stack of serially connected resistors R4, and a stack of serially connected resistors R5. In one embodiment, the sum resistance of the serially connected resistors R4 may equal the resistance of R3 as shown in FIG. 4, or ΣR4=R3, and the sum resistance of the serially connected resistors R5 may equal two times resistance of R3, or ΣR5=2*R3. The Pm node of the sub-circuit 502 may be at the middle point of the serially connected R5, namely, half of the serially connected R5 being connected from the source of NMOS 512 to Pm and half of R5 being connected from Pm to the ground. The serially connected R4 may be connected between the drain of NMOS 512 and an output of a Vgn generating circuit 426 as shown in FIG. 4. In one embodiment, the voltage from the drain of NMOS 512 (node Nm) may be supplied to the gates of those NMOS switches of the MSB's of DAC 504, and the voltage at node Pm may be supplied to those PMOS switches of the MSB's of DAC 504. In a preferred embodiment, the MSB's of DAC 505 may include those bits in segmental portion 508 of the segmented R-2R DAC. Thus, the Vgn and Vgp at the gates of the MOS switches for those MSB's may be reduced by Vds/2, where the Vds is a drain to source voltage drop as shown in FIG. 4.

For those less significant bits such as those bits in the R-2R portion 506 of the DAC, Vgn and Vgp at the gates of the MOS switches for those LSB's may be reduced according to the bit positions. In one embodiment, the amount of voltage offsets may decrease from a higher bit to a lower bit for those LSB's. Referring to FIG. 5, as an example for illustration, bits i+1, i, i−1 may have decreasing significance. Therefore, the voltage offset amounts of Vgn/Vgp for bits i+1, i, i−1 may accordingly decrease. In one embodiment, gate voltages for NMOS switches for bits i+1, i, i−1 may be from nodes Ni+1, Ni, Ni−1 in the sub-circuit 502 (or R4's at positions Ni+1, Ni, Ni−1 from the drain of NMOS 512), and gate voltages for PMOS switches for bits i+1, i, i−1 may be from nodes Pi+1, Pi, Pi−1 in the sub-circuit 502 (or R5's at positions Pi+1, Pi, Pi−1 from Pm node). In this way, the voltage offset amounts may proportionally decrease in accordance to bit positions for LSB's.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A digital-to-analog converter (DAC), comprising:
a resistor leg that is switchably connected to one of a first voltage reference via a first re-channel MOSFET (NMOS) and a second voltage reference via a first p-channel MOSFET (PMOS); and
a generator circuit including:
a first sub-circuit for generating a first drive voltage; and
a second sub-circuit for a) offsetting the first drive voltage by an offset voltage to generate a second drive voltage, and b) supplying the second drive voltage to a gate of one of the first NMOS and the first PMOS.

2. The digital-to-analog converter of claim 1, wherein the offset voltage is proportional to a drain-to-source voltage of a MOS device in the first sub-circuit for generating the first drive voltage.

3. The digital-to-analog converter of claim 1, wherein the first sub-circuit includes:
a second NMOS;
a second PMOS; and
a first op-amp, the first op-amp including:
a first input being coupled to a first end of a first resistor and a first end of a second resistor, a second end of each of the first and second resistors being coupled in series to one of a drain of the second NMOS and a drain of the second PMOS, respectively, a source of the second NMOS and a source of the second PMOS being coupled to the first voltage reference and the second voltage reference, respectively, a gate of the second PMOS being coupled to the first reference voltage;
a second input being coupled to a first end of a third resistor and a first end of a fourth resistor of equal resistance, a second end of each of the third and fourth resistor being coupled to the first voltage reference and the second voltage reference, respectively; and
an output being coupled to a gate of the second NMOS and outputting the first drive voltage.

4. The digital-to-analog converter of claim 3, wherein the second sub-circuit includes:
a third NMOS including a drain being coupled to a first end of a fifth resistor, a second end of the fifth resistor being coupled to the output of the first op-amp; and
a second op-amp including:
a first input being coupled to the drain of the second NMOS;
a second input being coupled to a source of the third NMOS and a first end of a sixth resistor, a second end of the sixth resistor being coupled to the first voltage reference through a serially-connected seventh resistor; and an output being coupled to a gate of the third NMOS.

5. The digital-to-analog converter of claim 4, wherein the drain of the third NMOS is coupled to the gate of the first NMOS for supplying the second drive voltage, and a common junction of the sixth and seventh resistors is coupled to the gate of the first PMOS for supplying the offset voltage.

6. The digital-to-analog converter of claim 5, wherein the first and second resistors have substantially equal resistance; the third and fourth resistors have substantially equal resistance; and the fifth, sixth, and seventh resistors have substantially equal resistance.

7. The digital-to-analog converter of claim 6, wherein the offset voltage substantially equals one half of a voltage across from the drain to the source of the second NMOS.

8. The digital-to-analog converter of claim 1, wherein the first voltage reference is a ground reference, and the second voltage reference corresponds to a digital bit.

9. The digital-to-analog converter of claim 8, wherein the digital bit is a most significant bit of a digital code that is to be converted into an analog output.

10. A generator circuit for a digital-to-analog converter (DAC), comprising:
   a first sub-circuit for generating a first drive voltage (Vgn); and
   a second sub-circuit for a) offsetting the first drive voltage by an offset voltage to generate a second drive voltage, and b) supplying the second drive voltage to a gate of one of the first NMOS and the first PMOS.

11. The generator circuit of claim 10, wherein the DAC includes
   a resistor leg that is switchably connected to one of a first voltage reference via the first NMOS and to a second voltage reference via the first PMOS.

12. The generator circuit of claim 11, wherein the offset voltage is proportional to a drain-to-source voltage of a MOS device in the first sub-circuit for generating the first drive voltage.

13. The generator circuit of claim 12, wherein the first sub-circuit includes:
   a second NMOS;
   a second PMOS; and
   a first op-amp, the first op-amp including:
      a first input being coupled to a first end of a first resistor and a first end of a second resistor, a second end of each of the first and second resistors being coupled in series to one of a drain of the second NMOS and a drain of the second PMOS, respectively, a source of the second NMOS and a source of the second PMOS being coupled to the first voltage reference and the second voltage reference, respectively, a gate of the second PMOS being coupled to the first reference voltage;
      a second input being coupled to a first end of a third resistor and a first end of a fourth resistor of equal resistance, a second end of each of the third and fourth resistor being coupled to the first voltage reference and the second voltage reference, respectively; and
      an output being coupled to a gate of the second NMOS and outputting the first drive voltage.

14. The generator circuit of claim 13, wherein the second sub-circuit includes:
   a third NMOS including a drain being coupled to a first end of a fifth resistor, a second end of the fifth resistor being coupled to the output of the first op-amp; and a second op-amp including:
   a first input being coupled to the drain of the second NMOS;
   a second input being coupled to a source of the third NMOS and a first end of a sixth resistor, a second end of the sixth resistor being coupled to the first voltage reference through a serially-connected seventh resistor; and
   an output being coupled to a gate of the third NMOS.

15. The generator circuit of claim 14, wherein the drain of the third NMOS is coupled to the gate of the first NMOS for supplying the second drive voltage, and a common junction of the sixth and seventh resistors is coupled to the gate of the first PMOS for supplying the offset voltage.

16. The generator circuit of claim 15, wherein the first and second resistors have substantially equal resistance; the third and fourth resistors have substantially equal resistance; the fifth, sixth, and seventh resistors have substantially equal resistance; and the offset voltage substantially equals one half of a voltage cross from the drain to the source of the second NMOS.

17. A digital-to-analog converter (DAC), comprising:
   a plurality of resistor legs, each resistor leg corresponding to a digital bit having a bit significance, each resistor leg being switchably connected to one of a first voltage reference and a second voltage reference via a respective MOS pair, the respective MOS pair each including a first NMOS and a first PMOS; and
   a generator circuit including:
      a first sub-circuit for generating a first drive voltage; and
      a second sub-circuit for a) offsetting the first drive voltage by a plurality of offset voltages to generate a plurality of second drive voltages and b) supplying each of the plurality of the second drive voltages and the corresponding offset voltages to the respective MOS pair.

18. The digital-to-analog converter of claim 17, wherein the first sub-circuit includes:
   a second NMOS;
   a second PMOS; and
   a first op-amp, the first op-amp including:
      a first input being coupled to a first end of a first resistor and a first end of a second resistor, a second end of each of the first and second resistors being coupled in series to one of a drain of the second NMOS and a drain of the second PMOS, respectively, a source of the second NMOS and a source of the second PMOS being coupled to the first voltage reference and the second voltage reference, respectively, a gate of the second PMOS being coupled to the first reference voltage;
      a second input being coupled to a first end of a third resistor and a first end of a fourth resistor of equal resistance, a second end of each of the third and fourth resistor being coupled to the first voltage reference and the second voltage reference, respectively; and
      an output being coupled to a gate of the second NMOS and outputting the first drive voltage.

19. The digital-to-analog converter of claim 18, wherein the second sub-circuit includes:
   a third NMOS including a drain being coupled to a first end of a plurality of serially-connected fifth resistors, a second end of the serially-connected fifth resistors being coupled to the output of the first op-amp; and
   a second op-amp including:
      a first input being coupled to the drain of the second NMOS;

a second input being coupled to a source of the third NMOS and a first end of a plurality of serially-connected sixth resistors, a second end of the plurality of serially-connected sixth resistors being coupled to the first voltage reference through a plurality of serially-connected seventh resistors; and an output being coupled to a gate of the third NMOS.

20. The digital-to-analog converter of claim 19, wherein voltages at junctions of the plurality of the serially-connected fifth resistors are supplied to gates of the first NMOS, respectively, and the voltages at junctions of the plurality of the serially-connected seventh resistors are supplied to gates of the first PMOS, respectively, in accordance to an order of bit significance of each resistor leg.

\* \* \* \* \*